US007075364B2

(12) United States Patent
Gudem et al.

(10) Patent No.: US 7,075,364 B2
(45) Date of Patent: Jul. 11, 2006

(54) ACTIVE-RC FILTER WITH COMPENSATION TO REDUCE Q ENHANCEMENT

(75) Inventors: Prasad Gudem, San Diego, CA (US); Peter C. Gazzerro, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/920,652

(22) Filed: Aug. 17, 2004

(65) Prior Publication Data

US 2006/0038610 A1   Feb. 23, 2006

(51) Int. Cl.
*H03K 5/00* (2006.01)
(52) U.S. Cl. ....................... 327/552; 327/558
(58) Field of Classification Search ........ 327/552–559; 330/107, 305
See application file for complete search history.

(56) References Cited

U.S. PATENT DOCUMENTS

| 4,057,766 A | * | 11/1977 | Lee | 330/107 |
| 5,117,199 A | * | 5/1992 | Wang et al. | 330/252 |
| 6,373,332 B1 | * | 4/2002 | Kawai | 327/556 |
| 6,930,544 B1 | * | 8/2005 | Yokoyama | 327/552 |

FOREIGN PATENT DOCUMENTS

JP    02001177063    * 6/2001

\* cited by examiner

*Primary Examiner*—Dinh T. Le
(74) *Attorney, Agent, or Firm*—Philip Wadsworth; Charles D. Brown; Donald C. Kordich

(57) ABSTRACT

An active filter with compensation to reduce Q-enhancement is disclosed. The filter may include a first amplifier and a second amplifier coupled to the first amplifier. The second amplifier having a negative feedback loop including a buffer having a plurality of compensation resistors. The compensation resistors may each have a value that results in the biquad filter having substantially zero Q-enhancement. The biquads may cascaded to form higher order filters.

25 Claims, 17 Drawing Sheets

ACTIVE-RC FILTER WITH COMPENSATION TO REDUCE Q ENHANCEMENT

BACKGROUND

1. Field

The present disclosure relates generally to electronics, and more specifically, to an active-RC filter with compensation to reduce Q-enhancement.

2. Background

Filters are used extensively today in almost every electronic application. A filter is an electrical network that alters the amplitude and/or phase characteristics of a signal as the frequency of the signal changes. Thus, a filter may be used in an electronic circuit to pass signals in certain frequency ranges and attenuate signals in other frequency ranges. The behavior of a filter may be described mathematically in the frequency-domain in terms of its transfer function. The transfer function describes, among other things, the ratio between the input signal amplitude and the output signal amplitude applied to the filter. The amplitude response curve describes the effect of the filter on the amplitude of the input signal at various frequencies. The steepness of the amplitude response curve is generally described in terms of the filter's quality factor Active filters may use amplifying elements, such as operational amplifiers ("op-amps"), with resistive and capacitive feedback, to generate the desired filter response. Active filters can be used to eliminate the need for inductors. These low-pass filters may be designed with a transfer function that has a steep rolloff around the pole frequency due primarily to the quality factor Q of each amplifying element. Unfortunately, the performance of these filters may suffer at high frequencies. In particular, the limited gain-bandwidth product of each amplifying element may cause Q-enhancement. Q-enhancement typically shows up as an undesirable peak in the amplitude around the pole frequency. This effect may be further exacerbated by the finite output impedance of the amplifying elements.

One way to reduce Q-enhancement is to design amplifying elements with a slightly lower Q, such that after Q-enhancement the desired Q-value results. One technique is to use "pre-distortion." The problem with using pre-distortion is that it is difficult to achieve low passband ripple across process, voltage and temperature variations.

Another way to reduce Q-enhancement is to construct an amplifier with a final output buffer stage using a source follower resulting in low output impedance. Unfortunately, the use of such a buffer stage may degrade performance, for example by limiting the output voltage swing of the operational amplifier and increasing the DC current of the operational amplifier.

Accordingly, there is a need in the art for high frequency, high-Q filters with low Q-enhancement across process, voltage and temperature variations using amplifying elements without a final output buffer stage.

SUMMARY

In one aspect of the invention, a biquad filter includes a first amplifier, and a second amplifier coupled to the first amplifier, the second amplifier having a negative feedback loop including a buffer having a plurality of compensation resistors, the compensation resistors each having a value that results in the biquad filter having substantially zero Q-enhancement.

In another aspect of the present invention, a biquad filter includes a first differential amplifier, and a second differential amplifier coupled to the first differential amplifier, the second amplifier having at least one compensation resistor connected across its differential input, and a negative feedback loop including a buffer having a plurality of compensation resistors, said at least one compensation resistor connected across the differential input of the second differential amplifier in combination with the compensation resistors in the negative feedback loop each having a value that results in the biquad filter having substantially zero Q-enhancement.

In yet another aspect of the present invention, a biquad filter includes a first differential amplifier having a pair of input resistors $R_1$ and a pair of negative feedback resistors $R_2$, a second differential amplifier having a pair of input resistors $R_3$ coupling the second differential amplifier to the first differential amplifier, the second differential amplifier further having a negative feedback loop comprising a buffer and a plurality of compensation resistors $R_{C2}$ coupled to the buffer, a negative feedback loop from the second amplifier back to the first amplifier, the negative feedback loop comprising a pair of negative feedback resistors $R_4$; and a load resistor $R_L$ coupled to the second amplifier. The resistors each have a value that satisfies the following equation:

$$\frac{R_{out1}}{R_1\|R_2\|R_3\|R_4} = \frac{R_{out2}}{R_L\|R_4\|R_{c2}} = \frac{R_{out3}}{R_{c2}}$$

In still another aspect of the present invention, a method of constructing a biquad filter includes coupling a pair of input resistors $R_1$ and a pair of negative feedback resistors $R_2$ to a first differential amplifier, coupling a second differential amplifier to the first differential amplifier through a pair of input resistors $R_3$, coupling a plurality of compensation resistors $R_{C2}$ to a buffer and placing the buffer and compensation resistors into a negative feedback loop of the second differential amplifier, coupling a pair of negative feedback resistors $R_4$ from the second differential amplifier back to the first differential amplifier, and selecting the resistor values for a load $R_L$ using the following equation:

$$\frac{R_{out1}}{R_1\|R_2\|R_3\|R_4} = \frac{R_{out2}}{R_L\|R_4\|R_{c2}} = \frac{R_{out3}}{R_{c2}}$$

In a further aspect of the present invention, an active filter includes a first biquad including a first amplifier and a second amplifier coupled to the first amplifier. The second amplifier has a negative feedback loop including a first buffer having a plurality of first compensation resistors. The first compensation resistors each have a value that results in the first biquad filter having substantially zero Q-enhancement. The filter also includes a second biquad having a third amplifier and a fourth amplifier coupled to the third amplifier. The third amplifier has a negative feedback loop including a second buffer having a plurality of second compensation resistors. The second compensation resistors each have a value that results in the third biquad filter having substantially zero Q-enhancement.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings wherein.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and devices are shown in block diagram form in order to avoid obscuring the concepts of the present invention. Acronyms and other descriptive terminology may be used merely for convenience and clarity and are not intended to limit the scope of the invention.

Figure 1:
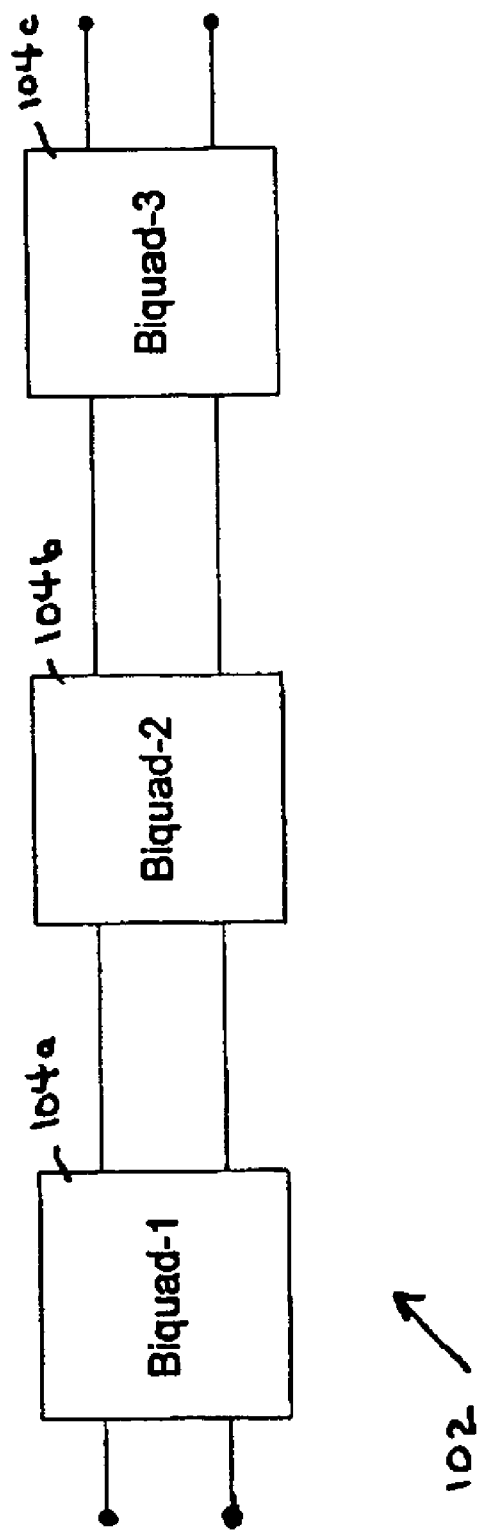
FIG. 1 is functional block diagram of an active filter with multiple biquad stages arranged in a cascaded fashion.

FIG. 1 is a functional block diagram of an active filter 102 with multiple biquad stages 104a–104c arranged in a cascaded fashion. Each biquad 104a–104c may be a second order low-pass filter. The total order of the active filter 102 is the sum of the orders of the cascaded biquads. In this example, the active filter 102 is a sixth order filter.

Figure 2:
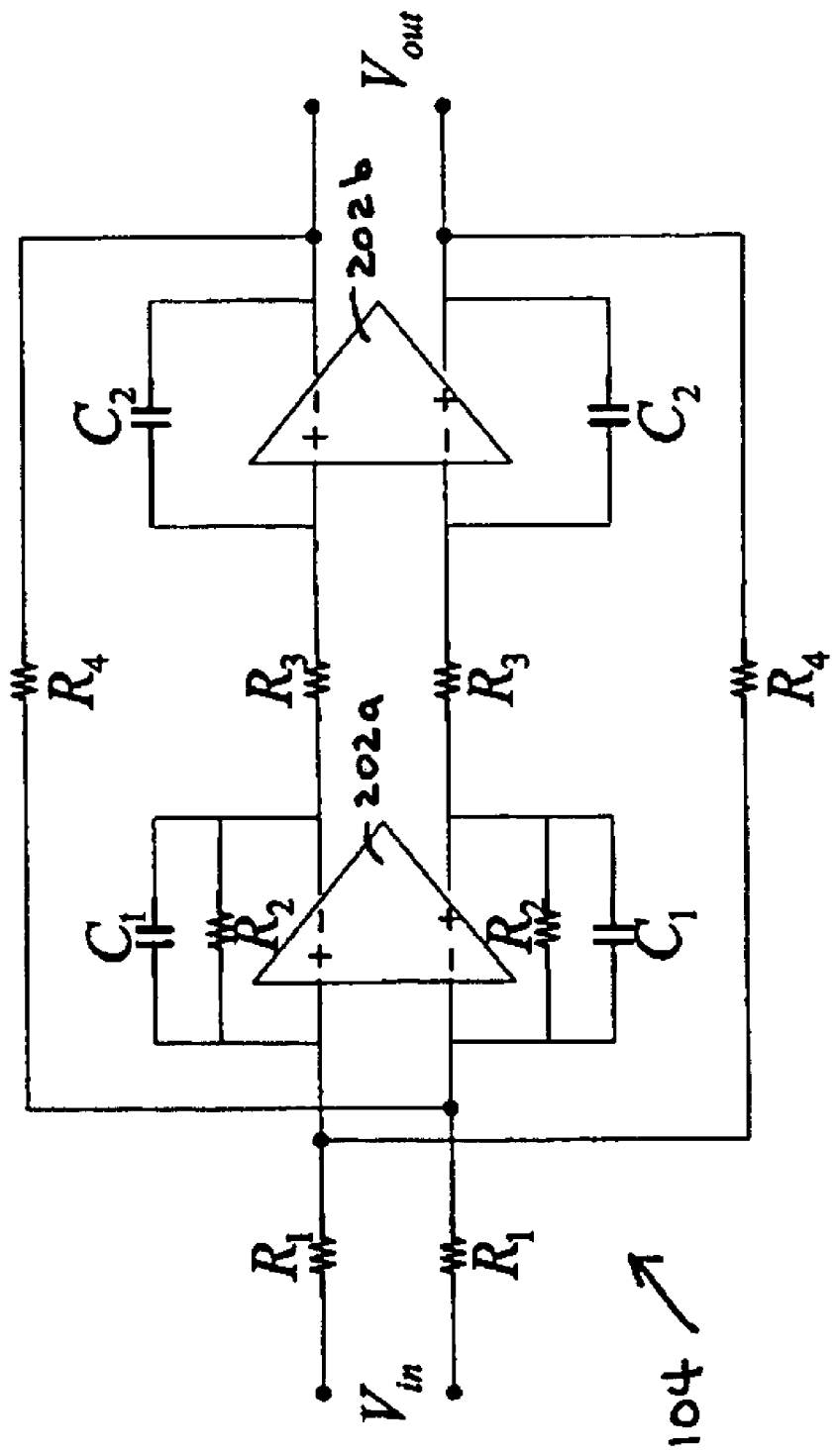
FIG. 2 is an schematic diagram of a biquad for an active filter.

FIG. 2 is a schematic diagram of a biquad 104 for the active filter of FIG. 1. The biquad 104 may be implemented with two differential op-amps 202a–202b. In the embodiment shown, the first op-amp 202a is in the input stage of the biquad 104 and the second op-amp 202b is in the output stage of the biquad 104. Alternatively, the second op-amp 202b could be used in the input stage of the biquad 104 and the first op-amp 202a could be used in the output stage of the biquad 104. Referring to the biquad of FIG. 2, the first op-amp 202a may include two input resistors $R_1$ and two negative feedback loops. Each feedback loop may include a parallel resistor $R_2$ and capacitor $C_1$ circuit. The second op-amp 202b may include two input resistors $R_3$ which couple the differential output of the first op-amp 202a to the input of the second op-amp 202b. The second op-amp 202b may also include two negative feedback loops with a capacitor $C_2$ in each feedback loop. The biquad 104 may also include two negative feedback loops with a resistor $R_4$ coupling the output of the second 202b to the input of the first 202a.

The transfer function of the biquad may be represented in the frequency domain by the following equation:

$$T(s) = \frac{A_V}{1 + \left(\frac{s}{Q\omega_0}\right) + \left(\frac{s}{\omega_0}\right)^2} \quad (1)$$

where: $A_V$ is the gain of the biquad;

$\omega_0$ is pole frequency of the biquad; and

Q is the quality factor of the biquad.

Figure 3:
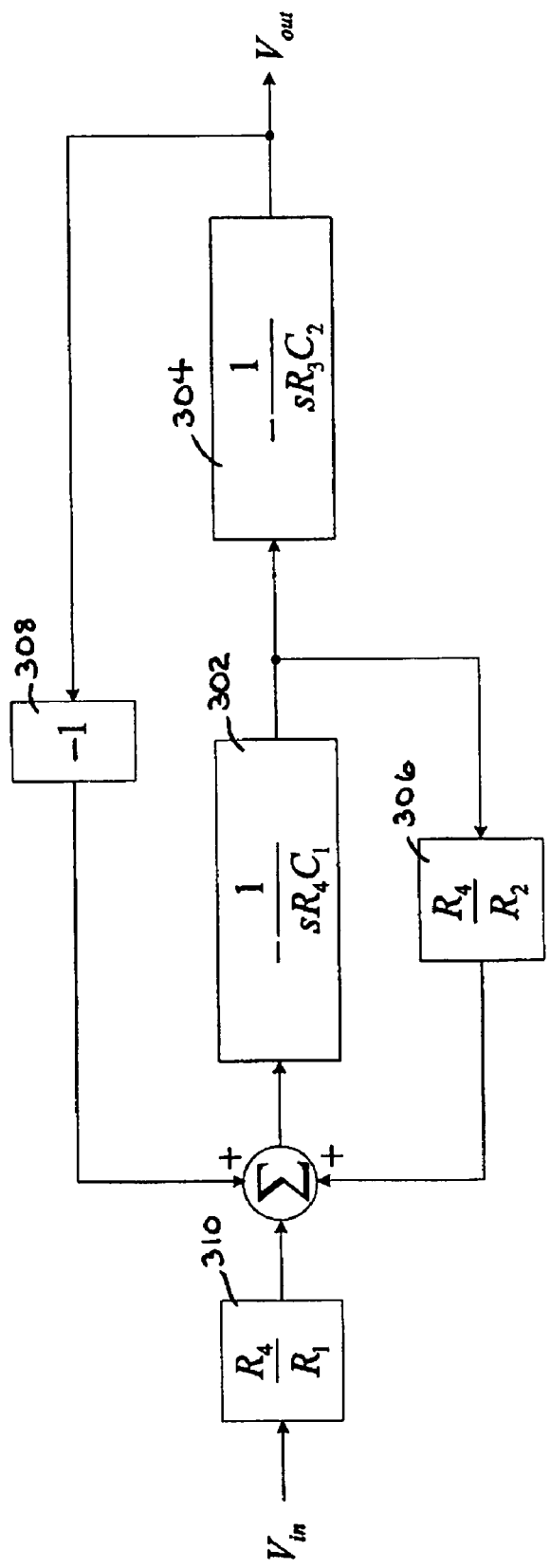
FIG. 3 is a system diagram of a biquad with two ideal op-amps.

A system diagram may be used to set the gain, pole frequency and Q-value of the biquad. FIG. 3 is a system diagram of the biquad with two ideal op-amps. The ideal op-amp is considered to have infinite gain, infinite input impedance, and zero output impedance. The transfer function of an ideal op-amp may be represented in the frequency domain by the following equation:

$$\frac{V_{out}}{V_{in}} = -\frac{1}{sRC} \quad (2)$$

The system diagram of FIG. 3 includes a first block 302 representing the transfer function for the first op amp, followed by a second block 304 representing the transfer function for the second op-amp. The transfer functions for the first and second blocks 302 and 304 may be derived from equation (2). A first feedback block 306 may be added to the first op-amp. A second feedback block 308 may be added to the biquad to represent negative feedback with the DC gain of the biquad being represented by a block 310 at the input. From the system diagram of FIG. 3, the transfer function can be computed as follows:

$$T(s) = \frac{R_4/R_1}{1+(R_4/R_2)\cdot[R_3C_2]s+[R_4C_1]\cdot[R_3C_2]s^2} \quad (3)$$

From equations (1) and (3), the gain, pole frequency and Q-value of the biquad shown in FIG. 2 may be determined. The resistors in the positive feedback loop $R_4$ in combination with the input resistors $R_1$ to the first op-amp 202a may be used to set the gain of the biquad 104 in accordance with the following equation:

$$A_v = R_4/R_1; \quad (4)$$

The feedback capacitors $C_1$ and $C_2$ in both the first and second op-amps 202a and 202b in combination with the input resistors $R_3$ to the second op-amp 202b and the resistors in the negative feedback loop $R_4$ of the biquad 104 may be used to determine the pole frequency of the biquad 104 in accordance with the following equation:

$$\omega_0 = 1/\sqrt{[R_4C_1]\cdot[R_3C_2]}; \quad (5)$$

Finally, the Q-value may be determined from the pole frequency in combination with the resistors $R_2$ in the negative feedback loop of the first op-amp 202a, the input resistors R3 and the capacitors $C_2$ in the negative feedback loop of the second op-amp 202b, and the resistors in the positive feedback loop $R_4$ of the biquad 104 in accordance with the following equation:

$$1/(Q\omega_0) = (R_4/R_2)\cdot[R_3C_2] \quad (6)$$

Figure 4:
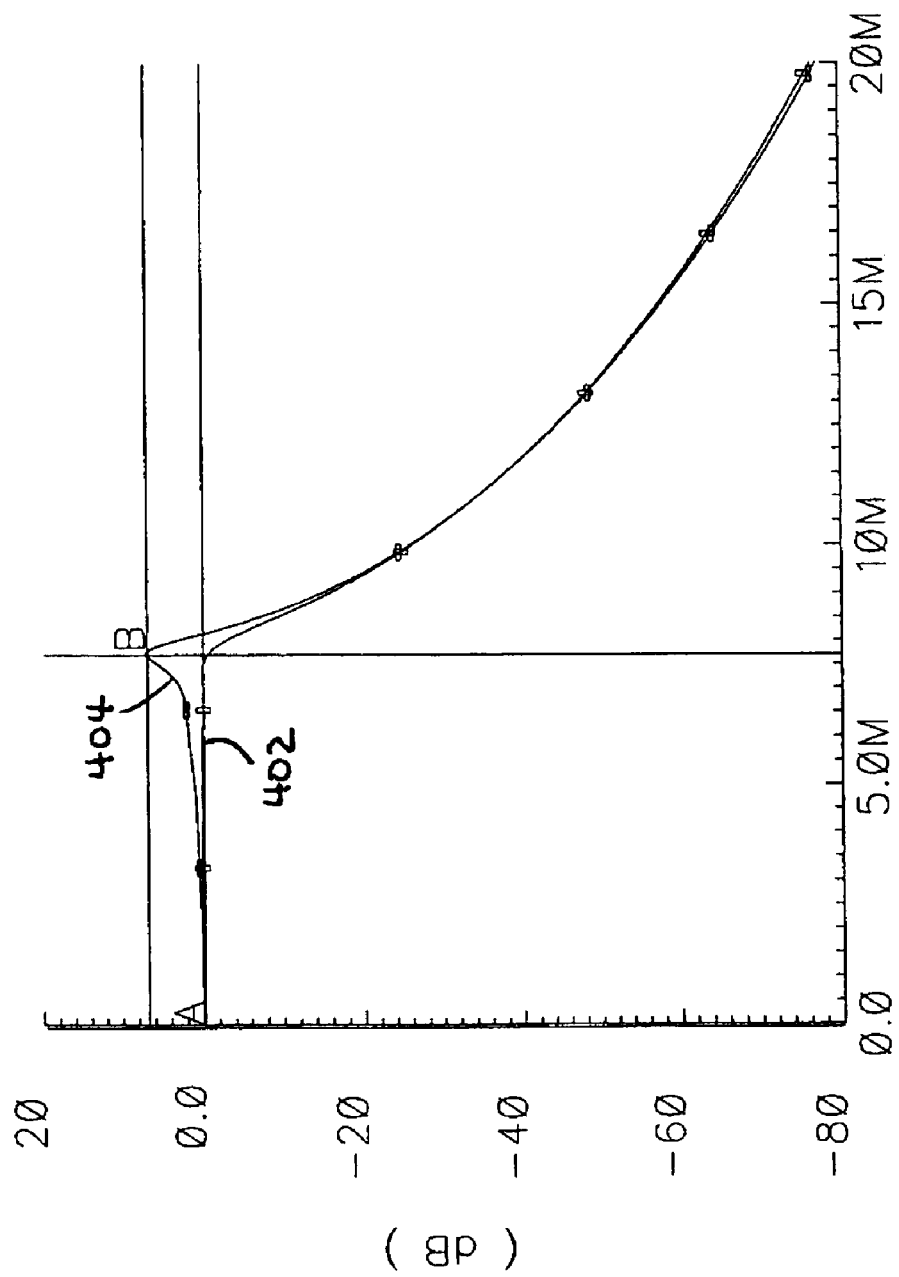
FIG. 4 is a graphical representation illustrating the differences in amplitude response between an ideal active filter and an active filter with a finite gain-bandwidth product.

FIG. 4 is a graphical representation illustrating the amplitude response of the active filter 102. As illustrated by equations (4)–(6), each biquad 104a–104c may be designed with a different gain, pole frequency and Q-value. By manipulating these design parameters, the active filter 102 of FIG. 1 may be implemented such that the combination of the cascaded biquads 104a–104c results in a relatively flat response over the frequency bandpass of interest with a steep rolloff around the pole frequency. The amplitude response curve 402 for a biquad with two ideal op-amps is shown in FIG. 4. Unfortunately, due to the finite gain-bandwidth product and the finite output impedance of the op-amps used in the biquads 104a–104c, the amplitude response of the active filter 102 may deviate from the ideal condition. As seen from the amplitude response curve 404 of the active filter, an undesirable peak in amplitude may occur around the pole frequency due to Q-enhancement. The magnitude of the peak 406 over the flat portion of the ideal response curve 402 defines the bandpass ripple of the active filter 102.

A parasitic pole introduced into the transfer function of the op-amp due to the finite gain-bandwidth product is the source of this Q-enhancement. The gain-bandwidth product may be defined by the transition frequency $\omega_t$ (i.e., the frequency at which the op-amp gain drops to unity). The extend of Q-enhancement may be determined from the system diagram of FIG. 5. The system diagram of FIG. 5 considers the effect of the finite gain-bandwidth product of the op-amps in the biquad. The transfer function of an integrator with a finite gain-bandwidth product may be represented in the frequency domain by the following equation:

$$\frac{V_{out}}{V_{in}} = -\frac{1}{sRC\cdot(1+s/\omega_1)} \quad (7)$$

Figure 5:
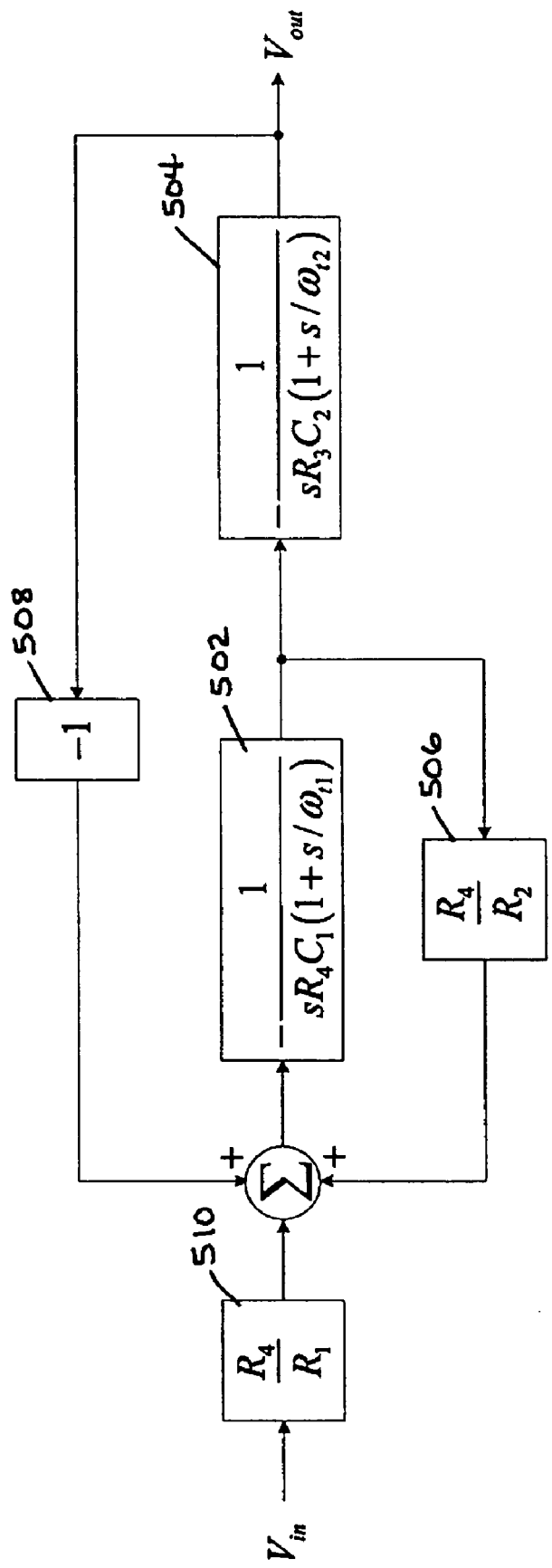
FIG. 5 is a system diagram of a biquad with op-amps having a finite gain-bandwidth product.

The system diagram of FIG. 5 is similar to that of FIG. 3, except that the op-amp transfer functions take into consideration the finite gain-bandwidth product. FIG. 5 includes a first block 502 representing the transfer function for the first op amp with a finite gain-bandwidth product, followed by a second block 504 representing the transfer function for the second op-amp with a finite gain-bandwidth product. The transfer functions for the first and second blocks 502 and 504 may be derived from equation (7). A first feedback block 506 may be added to the first op-amp. A second feedback block 508 may be added to the biquad to represent negative feedback with the DC gain of the biquad being represented by a block 510 at the input. From the system diagram of FIG. 5, the transfer function can be computed as follows:

$$T(s) = \frac{R_4/R_1}{1+\{(R_4/R_2)\cdot[R_3C_2]+[R_4C_1]\cdot} \quad (8)$$
$$[R_3C_2](\omega_0^2/\omega_{t1}+\omega_0^2/\omega_{t2})\}s+$$
$$\{[R_4C_1]\cdot[R_3C_2]+(R_4/R_2)\cdot[R_3C_2]/\omega_{t2}\}s^2$$

From equations (1) and (8), the gain, pole frequency and the Q-value of the biquad may be represented by the following equations:

$$\overline{A_v} = R_4/R_1; \quad (9)$$

$$\overline{\omega_0} = 1/\sqrt{[R_4C_1]\cdot[R_3C_2]+(R_4/R_2)\cdot[R_3C_2]/\omega_{t2}}; \quad (10)$$

$$1/(\overline{Q\omega_0}) = (R_4/R_2)\cdot[R_3C_2]-[R_4C_1]\cdot[R_3C_2](\omega_0^2/\omega_{t1}+\omega_0^2/\omega_{t2}) \quad (11)$$

Figure 6:
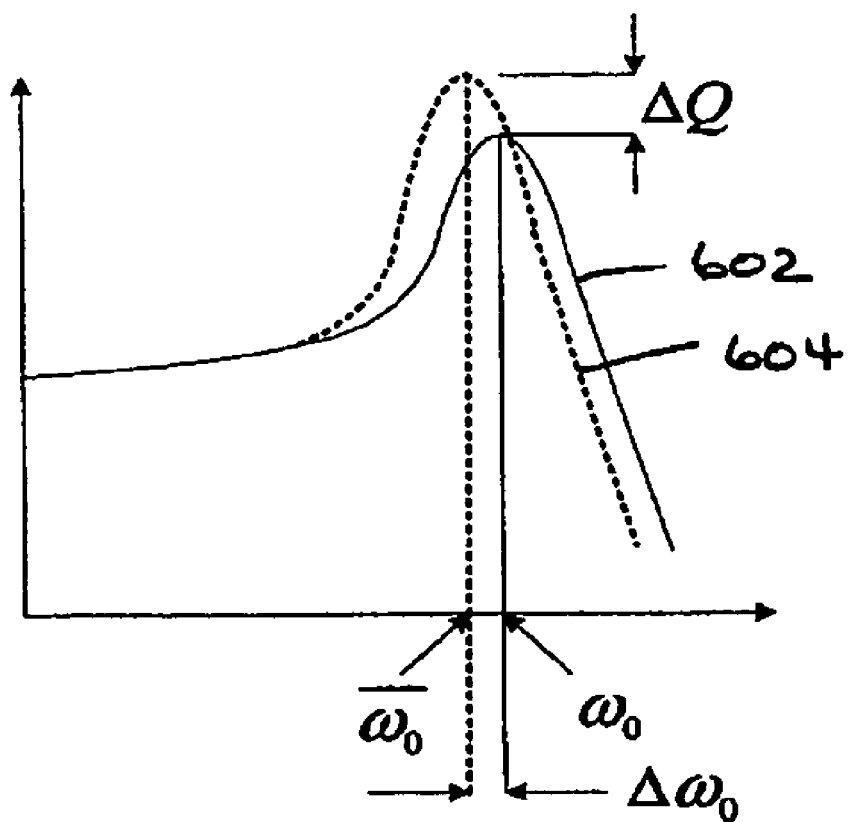
FIG. 6 is a graphical representation illustrating the change in the pole frequency and the Q-value of a biquad with op-amps having a finite gain-bandwidth product.

FIG. 6 is a graphical representation illustrating the change in the pole frequency and the Q-value when the finite gain-bandwidth product of the op-amps in the biquad is considered. The first amplitude response curve 602 shows the pole frequency and Q-value under ideal conditions. The second amplitude response curve 604 shows a reduction in the pole frequency ($\Delta\omega_0$) and an enhancement in the Q-value ($\Delta Q$) due to the finite gain bandwidth of the op-amps.

The enhancement in Q may then be computed as follows:

$$Q\text{-Enhancement} = \frac{\overline{Q}-Q}{Q} \approx Q\cdot\left(\frac{\omega_0}{\omega_{t1}}+\frac{\omega_0}{\omega_{t2}}\right) \quad (12)$$
$$\approx \frac{2Q\cdot f_0}{f_T}$$

Equation (12) shows that the Q-value increases inversely proportional to the gain-bandwidth product ($f_T$).

Compensation may be added to each biquad of the active filter to reduce or eliminate the effects of Q-enhancement. As discussed earlier, the source of Q-enhancement is the parasitic pole introduced into the transfer function of each op-amp when the finite gain-bandwidth product is considered. To compensate for this parasitic pole, a zero may be introduced into the closed loop transfer function. This may be achieved by adding a pole in the feedback path.

Figure 7:
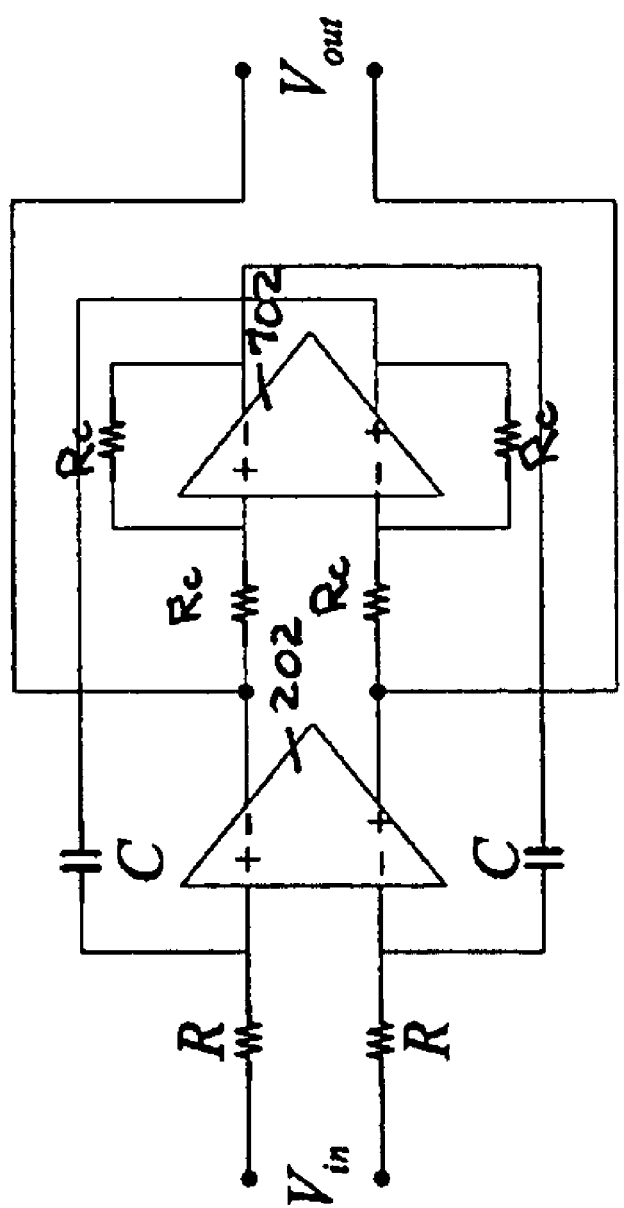
FIG. 7 is a schematic diagram of an op-amp with zero compensation.

FIG. 7 is a schematic diagram of an op-amp 202 with zero compensation. The op-amp 202 includes two input resistors R and two negative feedback capacitors C. A unity gain buffer 702 may be introduced into the feedback path with each differential output being coupled to one of the capacitors C. The gain of the buffer 702 may be set by two input resistors $R_C$ and two feedback resistors $R_C$. The transfer function of the op-amp 202 with zero compensation may be represented in the frequency domain by the following equation:

$$\frac{V_{out}}{V_{in}} = -\frac{1}{sRC(1 - s/\omega_t)} \quad (13)$$

Figure 8:
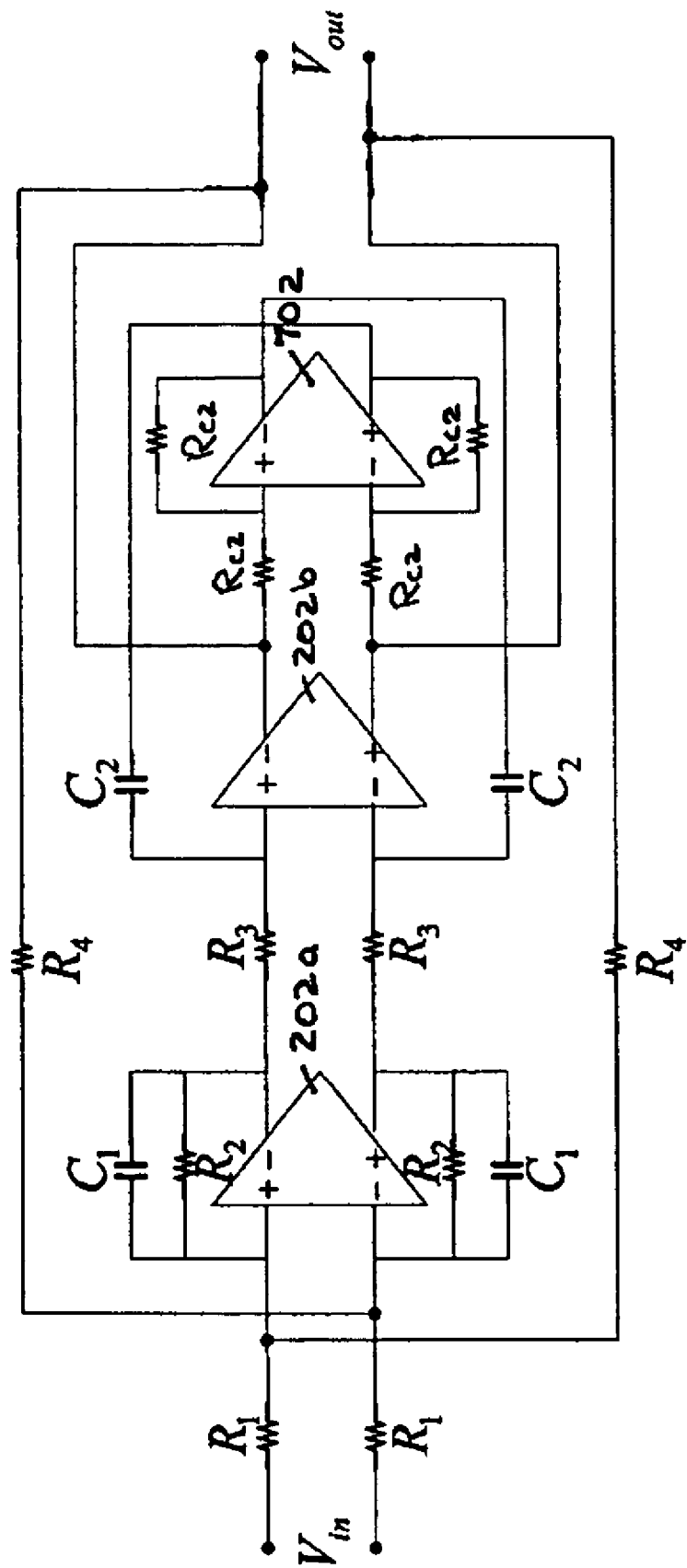
FIG. 8 is an schematic diagram of a biquad having op-amps with zero compensation.

FIG. 8 is an schematic diagram of a biquad having a two stage filter with zero compensation. Each stage may have a differential op-amp 202a and 202b. In the embodiment shown, the first op-amp 202a is in the input stage and the second op-amp 202b is in the output stage. Alternatively, the second op-amp 202b could be used in the input stage and the first op-amp 202a could be used in the output stage. Referring to the biquad of FIG. 8, the first op-amp 202a may include two input resistors $R_1$ and two negative feedback loops. Each feedback loop may include a parallel resistor $R_2$ and capacitor $C_1$ circuit. The second op-amp 202b may include two input resistors $R_3$ and two negative feedback capacitors $C_2$. A unity gain buffer 702 may be introduced into the feedback path with each differential output being coupled to one of the capacitors $C_2$. The gain of the buffer 702 may be set by two input resistors $R_C$ and two feedback resistors $R_C$. The biquad 104 may also include two negative feedback loops with a resistor $R_4$ coupling the output of the second 202b to the input of the first 202a.

Figure 9:
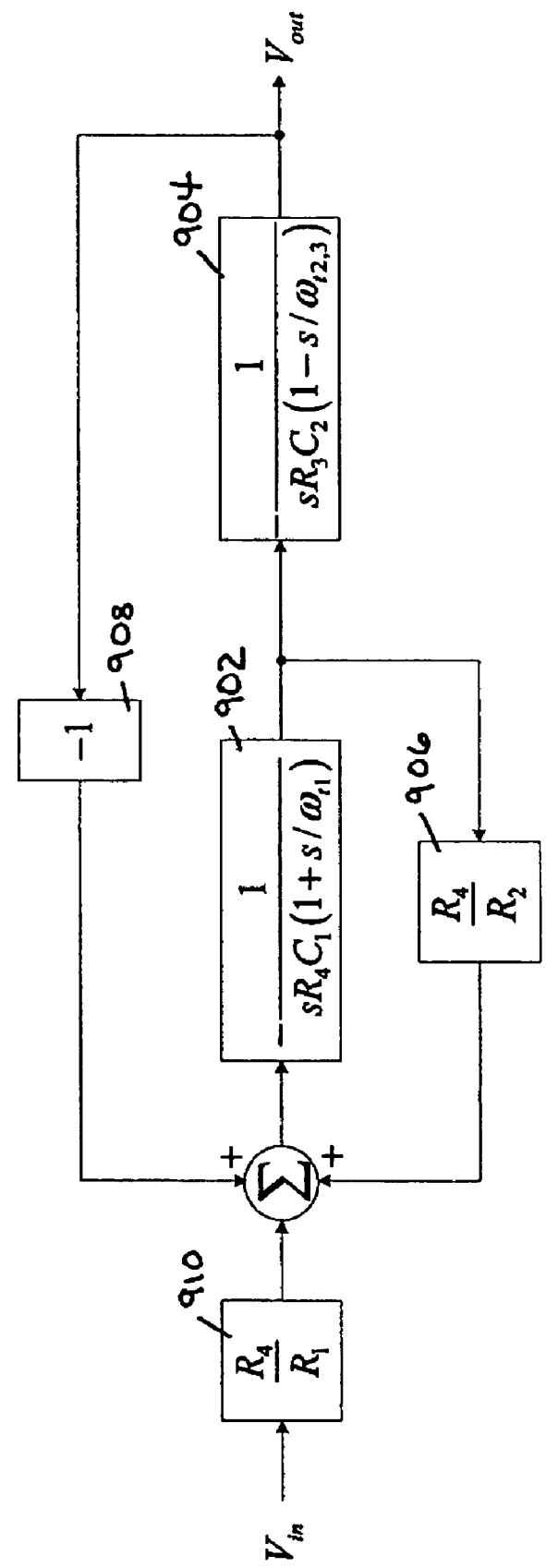
FIG. 9 is a system diagram of a biquad with op-amps having a finite gain-bandwidth and zero compensation.

The system diagram of FIG. 9 may be used to determine Q-enhancement for a biquad having a second op-amp with a zero to compensate for the finite gain-bandwidth product of both filters. The system diagram includes a first block 902 representing the transfer function for the first op amp, followed by a second block 904 representing the transfer function for the second op-amp with zero compensation. The transfer function for the first block 902 may be derived from equation (7) and the transfer function for the second block 904 may be derived from equation (13). A first feedback block 906 may be added to the first op-amp. A second feedback block 908 may be added to the biquad to represent negative feedback with the DC gain of the biquad being represented by a block 910 at the input. From the system diagram of FIG. 9, the transfer function can be computed as follows:

$$T(s) = \frac{R_4/R_1}{1 + \{(R_4/R_2) \cdot [R_3C_2] + [R_4C_1] \cdot [R_3C_2](s^2/\omega_{t1} + s^2/\omega_{t2,3})\}s + \{[R_4C_1] \cdot [R_3C_2] + (R_4/R_2) \cdot [R_3C_2]/\omega_{t2,3}\}s^2} \quad (14)$$

From equations (1) and (14), the gain, pole frequency and the Q-value of the biquad may be represented by the following equations:

$$\overline{A_v} = R_4/R_1; \quad (15)$$

$$\overline{\omega_0} = 1/\sqrt{[R_4C_1] \cdot [R_3C_2] + (R_4/R_2) \cdot [R_3C_2]/\omega_{t2,3}}; \quad (16)$$

$$1/(\overline{Q\omega_0}) = (R_4/R_2) \cdot [R_3C_2] - [R_4C_1] \cdot [R_3C_2](\omega_0^2/\omega_{t1} + \omega_0^2/\omega_{t2,3}) \quad (17)$$

From equations (6) and (17), the change in the Q-value can be represented by the following equation:

$$\overline{Q} = Q \cdot \frac{\sqrt{1 - \frac{\omega_0/Q}{\omega_{t2,3}}}}{1 - Q \cdot \left(\frac{\omega_0}{\omega_{t1}} + \frac{\omega_0}{\omega_{t2,3}}\right)} \quad (18)$$

$$\approx Q \cdot \left[1 + Q \cdot \left(\frac{\omega_0}{\omega_{t1}} - \frac{\omega_0}{\omega_{t2,3}}\right)\right]$$

$$= Q$$

Equation (18) shows that the biquad with a second op-amp having zero compensation experiences no Q-enhancement across process, voltage, and temperature variations.

The next step in the analysis is to consider the effect of the output impedance of the filters on the Q-value. Equation (18) assumes that the output impedance of the filters is zero. However, in reality, each op-amp has a finite output impedance which can result in significant Q-enhancement. More specifically, the transfer of an op-amp with a finite output impedance may be represented by the following equation:

$$\frac{V_{out}}{V_{in}} = \frac{1}{sRC(1 + s/\overline{\omega_t})} \text{ where:} \quad (19)$$

$$\overline{\omega_t} = \frac{\omega_t}{\left[\frac{R_{out}}{R_{out}\|R}\right]}$$

As evident from equation (19), the effective gain-bandwidth product $f_t$ gets reduced by a factor of $(1+R_{out}/R)$. Moreover, the Q-value varies with process, voltage and temperature variations in $R_{out}$ and R.

Figure 10:
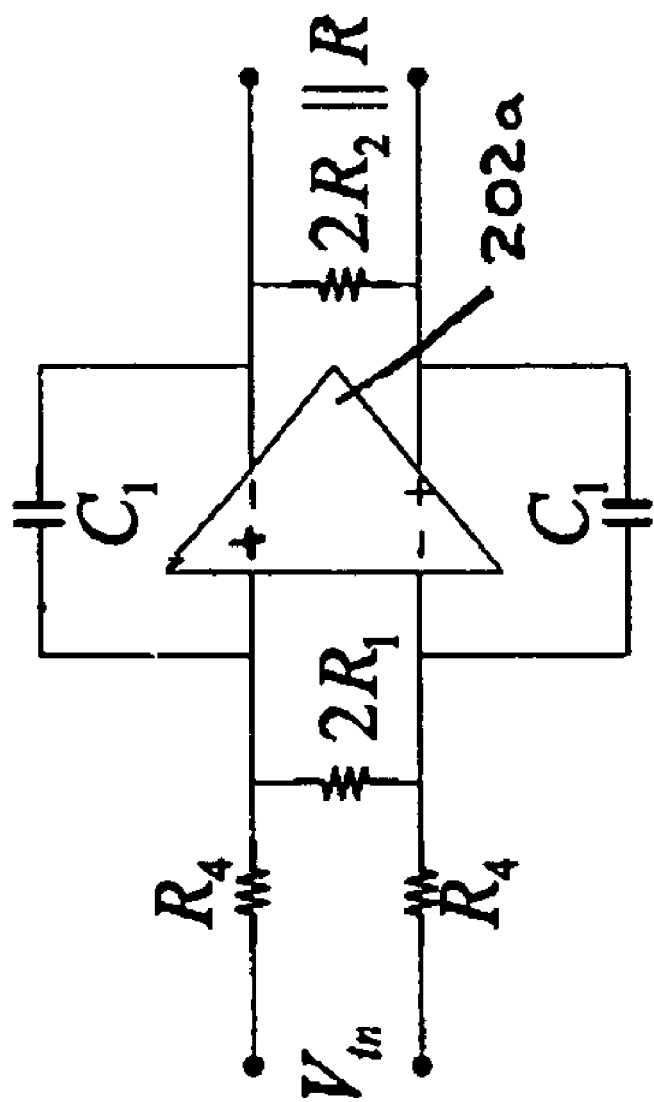
FIG. 10 is a schematic block diagram modeling the first op-amp of a biquad.

To compensate for the finite output impedance of the filters, additional compensation may be used. To determine the nature of the compensation, both op-amps will be individually evaluated. FIG. 10 is a schematic block diagram modeling the first op-amp 202a of the biquad of FIG. 8. The loading at the input to the first op-amp 202a may be represented with the two negative feedback resistors $R_4$ of the biquad positioned at the input of the first op-amp 202a, and the two input resistors $R_1$ of the biquad connected across the differential input of the first op-amp 202a. The two feedback capacitors $C_1$ of the first op-amp 202a remain in the feedback loop. The output loading of the first op-amp 202a may be represented by an impedance across the differential output equal to twice the parallel combination of the feedback resistors $R_2$ to the first op-amp 202a and the input resistors $R_3$ to the second op-amp 202b. The transfer function of the first op-amp 202a may then be computed from the following equation:

$$\frac{V_{out}}{V_{in}} = -\frac{1}{sR_4C_1(1 + s/\overline{\omega_{t1}})} \text{ where:} \quad (20)$$

$$\overline{\omega_{t1}} = \frac{\omega_{t1}}{\left[\frac{R_{out1}}{(R_1\|R_2\|R_3\|R_4\|R_{out1})}\right]}$$

The effective gain-bandwidth product $f_t$ of the first op-amp 202a (as far as Q-enhancement is concerned) gets reduced by the factor shown in equation (20). Therefore, the loading at the input and the output of the first op-amp 202a further exacerbate the Q-enhancement in addition to making it process, voltage and temperature dependent.

Figure 11:
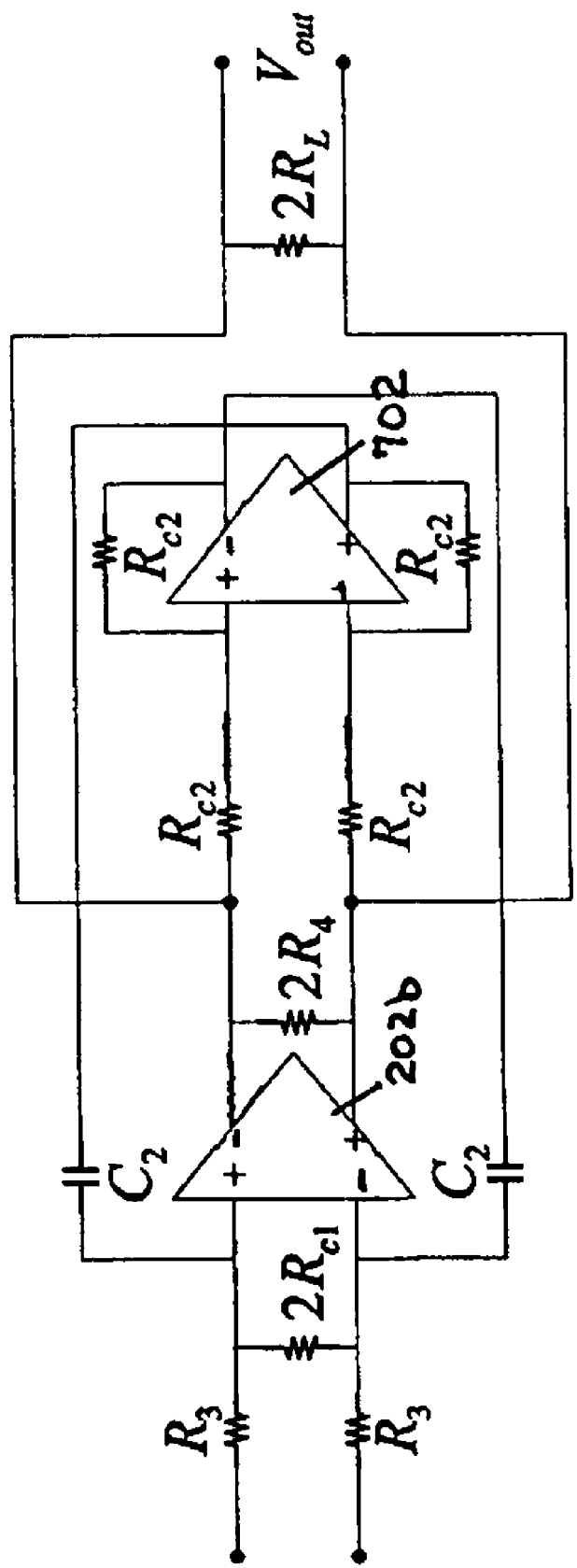
FIG. 11 is a schematic block diagram modeling the second op-amp of a biquad.

FIG. 11 is a schematic block diagram modeling the second op-amp 202b of the biquad of FIG. 8. The loading at the input to the second op-amp 202b remains unchanged with the two input resistors $R_3$. Two compensation resistors $R_{C1}$ may also be connected across the differential input of the first op-amp 202a. As will be shown later, these compensation resistors $R_{C1}$ do not effect the Q-enhancement, and therefore, may be omitted. However, the compensation resistors $R_{C1}$ do provide a method for adjusting the pole frequency $\omega_0$ of the biquad. The ability to adjust the pole frequency $\omega_0$ of the biquad may provide a means for fine tuning an active filter with multiple biquad stages to further reduce bandpass ripple.

The feedback loop of the second op-amp remains unchanged with the two negative feedback capacitors $C_2$ and the unity gain buffer 702. The gain of the buffer 702 may be set by two input compensation resistors $R_{C2}$ and two negative feedback compensation resistors $R_{C2}$. As will be shown later, the compensation resistors $R_{C2}$ may be selected to compensate for the Q-enhancement due to the finite output impedance of the first and second op-amps.

The output loading of the second op-amp 202b may be represented by the two negative feedback resistors $R_4$ of the biquad and two load resistors $R_L$ all connected across the differential output.

The transfer function of the second op-amp 202b may be computed from the following equation:

$$\frac{V_{out}}{V_{in}} = -\frac{1}{sR_3C_2(1 - s/\overline{\omega_{t2,3}})} \quad \text{where:} \tag{21}$$

$$\frac{1}{\overline{\omega_{t2,3}}} = \frac{2}{\overline{\omega_{t3}}} - \frac{1}{\omega_{t2}}; \quad \overline{\omega_{t2}} = \frac{\omega_{t2}}{\left[\frac{R_{out2}}{(R_L \| R_4 \| R_{c2} \| R_{out2})}\right]};$$

$$\overline{\omega_{t3}} = \frac{\omega_{t3}}{\left[\frac{\frac{R_{c2}}{2}}{\frac{R_{c2}}{2}} \cdot \frac{R_{out3}}{R_{out3} \| R_{c2}}\right]}$$

Figure 12:
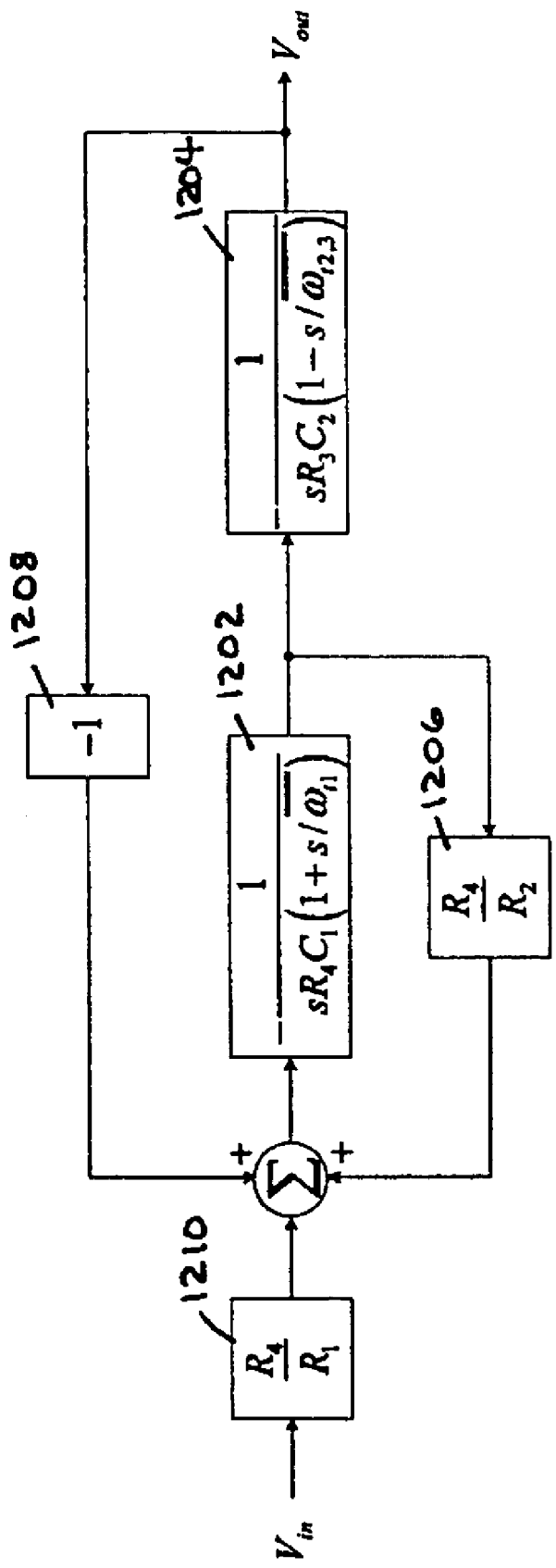
FIG. 12 is a system diagram of a biquad with op-amps having a finite gain-bandwidth, zero compensation, and a finite output impedance.

The system diagram of FIG. 12 may be used to determine the compensation needed to reduce or eliminate the effects of Q-enhancement. The system diagram includes a first block 1202 representing the transfer function for the first op-amp, followed by a second block 1204 representing the transfer function for the second op-amp. The transfer function for the first block 1202 may be derived from equation (20) and the transfer function for the second block 1204 may be derived from equation (21). A first feedback block 1206 may be added to the first op-amp. A second feedback block 1208 may be added to the biquad to represent negative feedback with the DC gain of the biquad being represented by a block 1210 at the input.

The condition for zero Q-enhancement of a biquad:

$$\frac{1}{\overline{\omega_{t1}}} - \frac{1}{\overline{\omega_{t2,3}}} = 0 \tag{22}$$

$$\Rightarrow \frac{2}{\overline{\omega_{t3}}} = \frac{1}{\overline{\omega_{t1}}} + \frac{1}{\overline{\omega_{t1}}} \tag{23}$$

$$\Rightarrow 2 \cdot \frac{\frac{R_{c2}}{2}}{\frac{R_{c2}}{2}} \cdot \frac{R_{out3}}{R_{out3} \| R_{c2}} \cdot \frac{1}{\omega_{t3}} = \tag{24}$$

$$\frac{R_{out2}}{R_L \| R_4 \| R_{c2} \| R_{out2}} \cdot \frac{1}{\omega_{t2}} + \frac{R_{out1}}{R_1 \| R_2 \| R_3 \| R_4 \| R_{out1}} \cdot \frac{1}{\omega_{t1}}$$

$$\Rightarrow 2 \cdot \frac{\frac{R_{c2}}{2}}{R_{c2}} \cdot \frac{\left(1 + \frac{R_{out3}}{R_{c2}}\right)}{1} \cdot \frac{1}{\omega_{t3}} = \tag{25}$$

$$\frac{\left(1 + \frac{R_{out2}}{R_L \| R_4 \| R_{c2}}\right)}{1} \cdot \frac{1}{\omega_{t2}} + \frac{\left(1 + \frac{R_{out1}}{R_1 \| R_2 \| R_3 \| R_4}\right)}{1} \cdot \frac{1}{\omega_{t1}}$$

Equation (25) may be simplified by assuming that the transition frequency $\omega_t$ of each op-amp in an integrated circuit is substantially the same. With this assumption, the following relationship may be established:

$$\frac{R_{out1}}{R_1 \| R_2 \| R_3 \| R_4} = \frac{R_{out2}}{R_L \| R_4 \| R_{c2}} = \frac{R_{out3}}{R_{c2}} \tag{26}$$

By satisfying equation (26), substantially zero Q-enhancement may be achieved and maintained across process, voltage and temperature variations. The term "substantially" in reference to zero Q-enhancement means a Q-enhancement that results in an acceptable error rate or signal-to-noise ratio for the particular application employing the filter.

Figure 13:
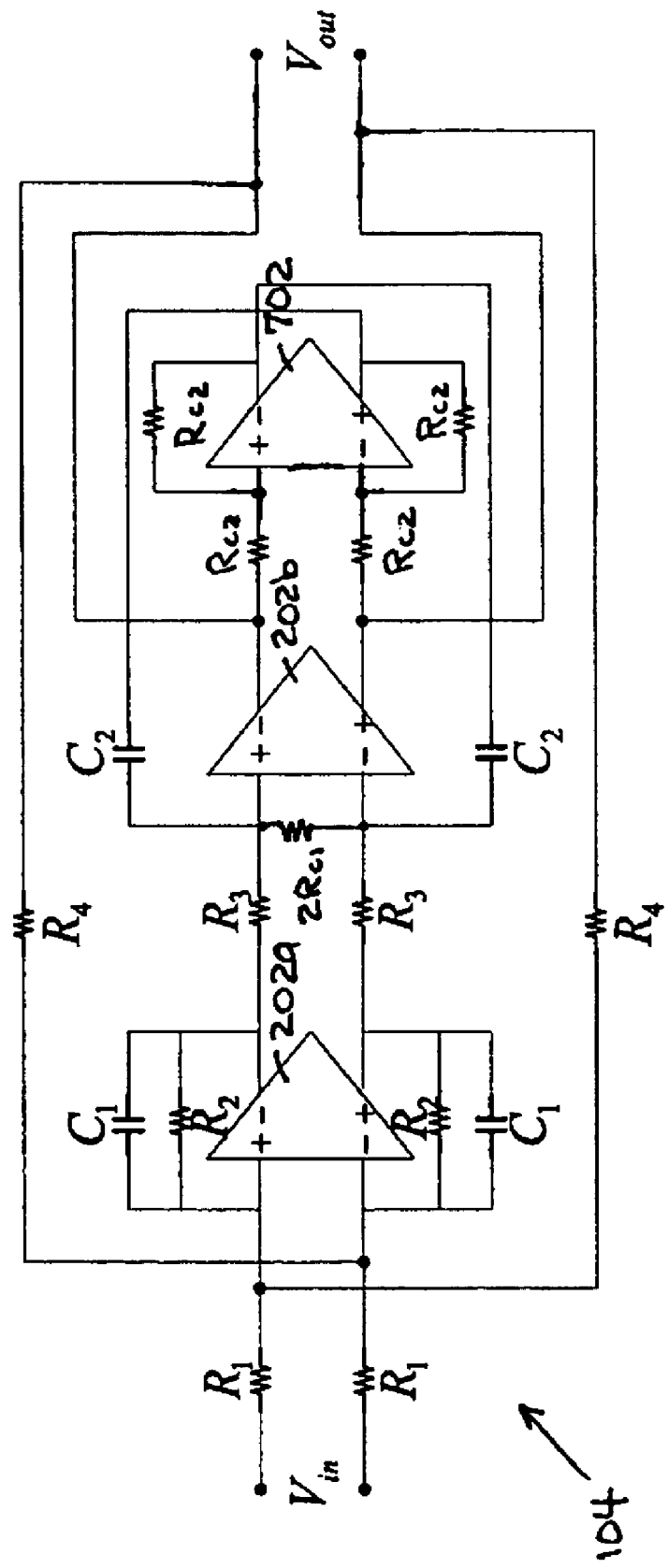
FIG. 13 is a schematic block diagram of a biquad compensated for substantially zero Q-enhancement.

FIG. 13 is a schematic diagram of a biquad compensated for Q-enhancement. The biquad 104 may be constructed as a two stage filter. Each stage may have a differential op-amp 202a and 202b. The first op-amp 202a is shown in the input stage and the second op-amp 202b is shown in the output stage. The first op-amp 202a may include two input resistors $R_1$ and two negative feedback loops. Each feedback loop may include a parallel resistor $R_2$ and capacitor $C_1$ circuit. The second op-amp 202b may include two input resistors $R_3$ and two negative feedback capacitors $C_2$. A first compensation resistor $2R_{C1}$ may be connected across the differential input of the second op-amp 202b to adjust the pole frequency. A unity gain buffer 702 may be introduced into the feedback path with each differential output being coupled to one of the capacitors $C_2$. A pair of input and feedback resistors $R_{C2}$ may be coupled to the buffer 702 to compensate for Q-enhancement. The biquad 104 may also include two negative feedback loops with a resistor $R_4$ coupling the output of the second op-amp 202b to the input of the first op-amp 202a.

Figure 14:
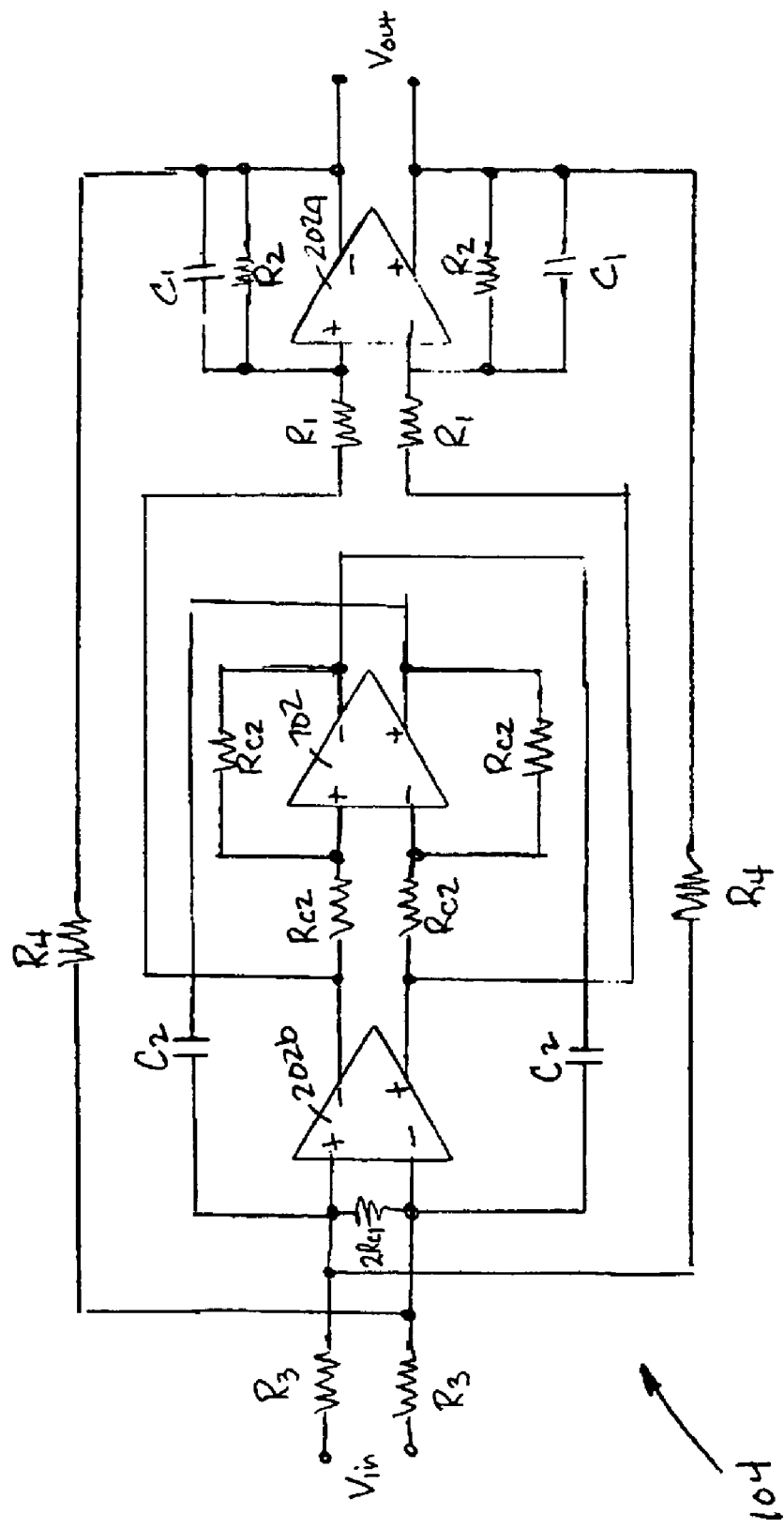
FIG. 14 is a schematic block diagram of an alternative embodiment of a biquad compensated for substantially zero Q-enhancement.

Alternatively, the order of the differential op-amps 202a and 202b in the two stage biquad 104 may be changed. That is, the second op-amp 202b may be used in the input stage of the biquad 104, and the first op-amp 202a may be used in the output stage of the biquad 104. A biquad with this configuration is shown in FIG. 14. The second op-amp 202b may include two input resistors $R_3$ and two negative feedback capacitors $C_2$. A first compensation resistor $2R_{C1}$ may be connected across the differential input of the second op-amp 202b to adjust the pole frequency. A unity gain buffer 702 may be introduced into the feedback path with each differential output being coupled to one of the capacitors $C_2$. A pair of input and feedback resistors $R_{C2}$ may be coupled to the buffer 702 to compensate for Q-enhancement. The first op-amp 202a may include two input resistors $R_1$ and two negative feedback loops. Each feedback loop may include a parallel resistor $R_2$ and capacitor $C_1$ circuit. The biquad 104 may also include two negative feedback loops with a resistor $R_4$ coupling the output of the first op-amp 202a to the input of the second op-amp 202b.

Figure 15:
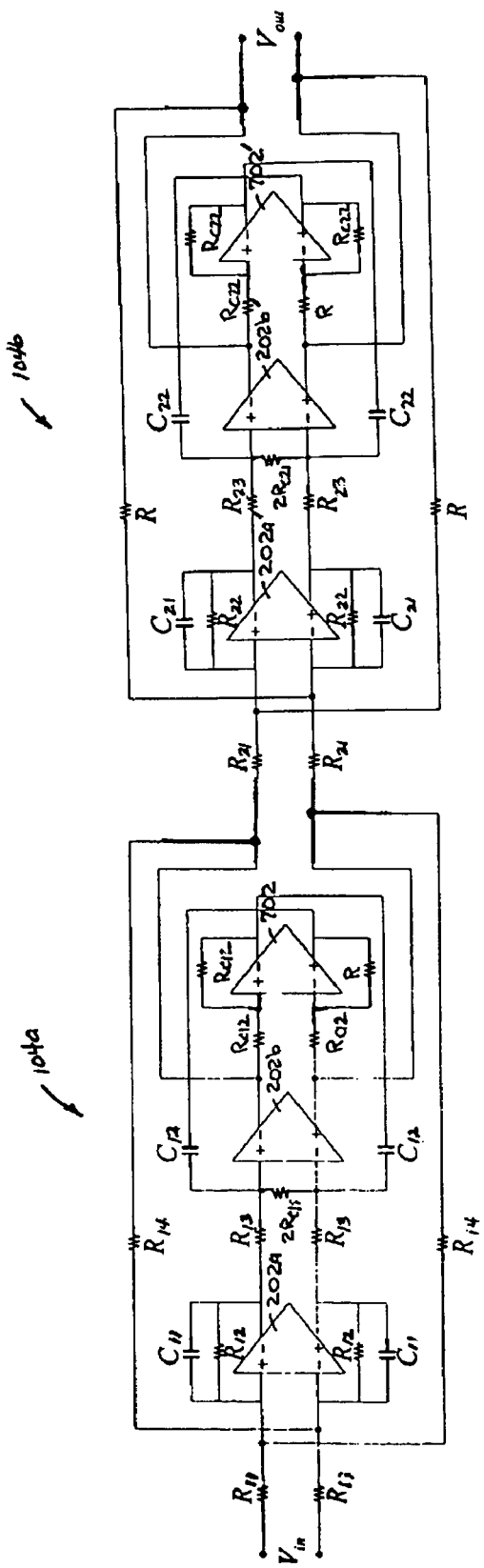
FIG. 15 is a schematic block diagram of a fourth order filter with two cascaded biquads compensated for substantially zero Q-enhancement.

The biquads described thus far may be cascaded to form higher order filters. An example is shown in FIG. 15 for a $4^{th}$ order filter. The first biquad 104a is identical to the biquad shown in FIG. 13, but could alternatively be implemented with the biquad shown in FIG. 14. The biquad 104a may be configured with substantially zero Q-enhancement across process, voltage and temperature variations by satisfying equation (27) below:

$$\frac{R_{out11}}{R_{11}\|R_{12}\|R_{13}\|R_{14}} = \frac{R_{out12}}{R_L\|R_{14}\|R_{c12}} = \frac{R_{out13}}{R_{c12}} \quad (27)$$

where $R_L$ is equal to $R_{21}$ in the second stage biquad 104b.

The second biquad 104b is also identical to the biquad shown in FIG. 13, but could also be implemented with the biquad shown in FIG. 14 in an alternative configuration. The biquad 104b may be configured with substantially zero Q-enhancement across process, voltage and temperature variations by satisfying equation (28) below:

$$\frac{R_{out21}}{R_{21}\|R_{22}\|R_{23}\|R_{24}} = \frac{R_{out22}}{R_L\|R_{24}\|R_{c22}} = \frac{R_{out23}}{R_{c22}}. \quad (28)$$

Figure 16:
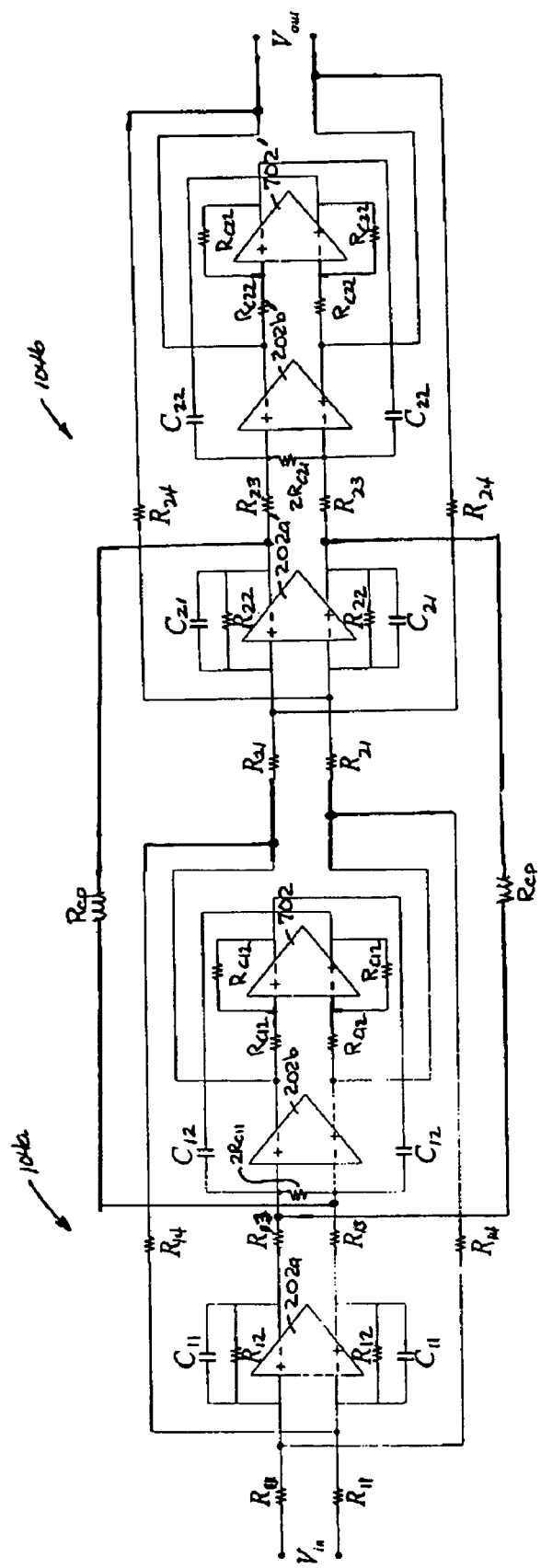
FIG. 16 is a schematic block of a fourth order filter with two ladder biquads compensated substantially for zero Q-enhancement.

In an alternative embodiment, the $4^{th}$ order filter may be implemented in a ladder configuration as shown in FIG. 16. The filter is substantially the same as shown in FIG. 15, except for the addition of feedback between the two biquads 104a and 104b. More specifically, the filter may be implemented with two negative feedback loops from the output of the first op-amp 202a' in the second biquad 104b to the input of the second op-amp 202b in the first biquad 104a. Each feedback loop may include a coupling resistor $R_{cp}$. The coupling resistor $R_{cp}$ may be selected to optimize filter performance, but should not have an effect on Q-enhancement. Equations (27) and (28) may still be used to configure each biquad of the filter so that the $4^{th}$ order filter has substantially zero Q-enhancement across process, voltage, and temperature variations.

Figure 17:
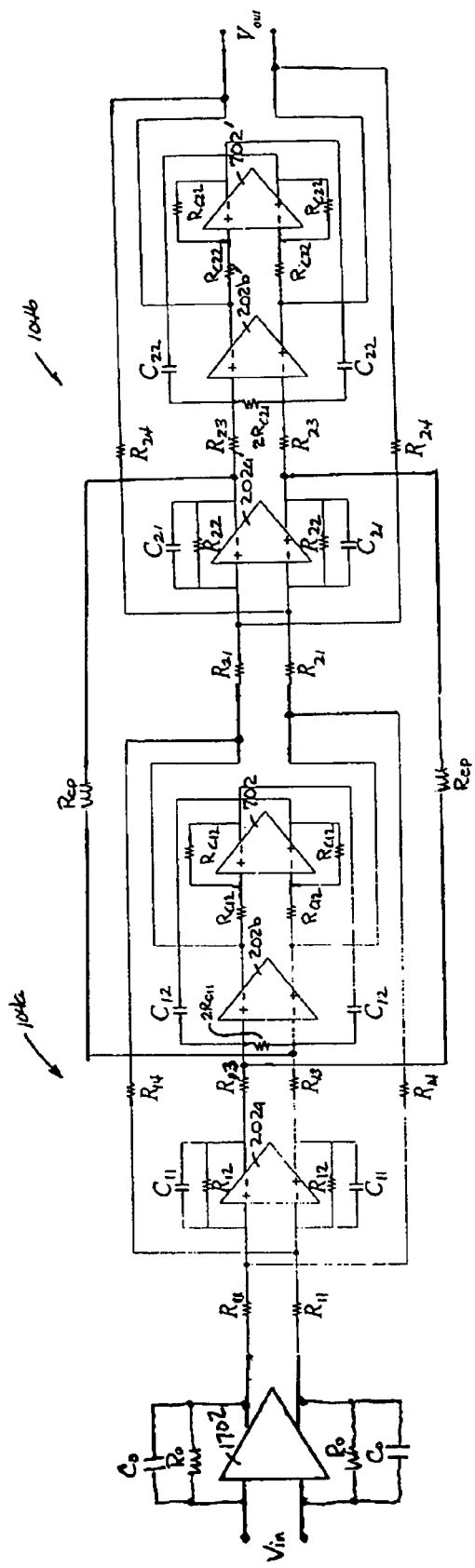
FIG. 17 is a schematic block diagram of a fifth order filter with two ladder biquads compensated substantially for zero Q-enhancement.

Those skilled in the art will readily be able to implement any order filter with substantially zero Q-enhancement across process, voltage and temperature variations by cascading multiple biquads. In the event that a nth order filter is desired, where n is an odd number, a transimpedance stage may be added to the input or output of the filter. An example of such a filter is shown in FIG. 17 with a transimpedance stage at the input to the filter of FIG. 16. The transimpedance stage includes an op-amp 1702 with two negative feedback loops. Each feedback loop may include a parallel resistor $R_0$ and capacitor $C_0$ circuit. This configuration results in a $5^{th}$ order filter having substantially zero Q-enhancement across process, voltage and temperature variations.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A biquad filter, comprising:
   a first amplifier; and
   a second amplifier coupled to the first amplifier, the second amplifier having a negative feedback loop including a buffer having a plurality of compensation resistors, the compensation resistors each having a resistance value that results in the biquad filter having substantially zero Q-enhancement, wherein Q-enhancement represents an undesirable peak in amplitude around a pole frequency of an amplitude frequency response for the biquad filter,
   wherein an input of the first amplifier is coupled to an input to the biquad filter and an output of the second amplifier is coupled to an output for the biquad filter when an cutout of the first amplifier is coupled to an input of the second amplifier, and
   wherein the input of the second amplifier is coupled to the input to the biquad filter and the output of the first amplifier is coupled to the output for the biquad filter when the output of the second amplifier is coupled to the input of the first amplifier.

2. The biquad filter of claim 1 wherein the resistance value of each of the compensation resistors results in the biquad filter having substantially zero Q-enhancement across process, voltage and temperature variations of the biquad filter.

3. The biquad filter of claim 1 wherein a gain of the buffer is set by the compensation resistors.

4. The biquad filter of claim 3 wherein the buffer comprises a unity gain buffer.

5. The biquad filter of claim 1 wherein the first amplifier comprises a first operational amplifier and the second amplifier comprises a second operational amplifier.

6. The biquad filter of claim 1 wherein the first and second amplifiers each comprises a differential amplifier.

7. The biquad fitter of claim 6 further comprising at least one compensation resistor, different from the plurality of compensation resistors, connected across the differential input of the second amplifier.

8. The biquad filter of claim 7 wherein the biquad filter has a pole frequency, the pole frequency being a function of said at least one compensation resistor.

9. The biquad filter of claim 1 further comprising an input and output stage, wherein the input stage includes the first amplifier and the output stage includes the second amplifier when the output of the first amplifier is coupled to the input of the second amplifier.

10. The biquad filter of claim 1 further comprising an input and output stage, wherein the input stage includes the second amplifier and the output stage includes the first amplifier when the output of the second amplifier is coupled to the input of the first amplifier.

11. A biquad filter, comprising:
   a first differential amplifier; and
   a second differential amplifier coupled to the first differential amplifier, the second amplifier having at least one compensation resistor connected across its differential input, and a negative feedback loop including a buffer having a plurality of compensation resistors, different from the at least one compensation resistor, said at least one compensation resistor connected across the differential input of the second differential amplifier and the plurality of compensation resistors in the negative feedback loop each having a resistance value than results in the biquad filter having substantially zero Q-enhancement, wherein Q-enhancement represents an undesirable peak in amplitude around a pole frequency of an amplitude frequency response for the biquad filter, wherein an input of the first differential amplifier is coupled to an input to the biquad filter and an output of the second differential amplifier is coupled to an output for the biquad filter when an output of the first differential amplifier is coupled to an input of the second differential amplifier, and wherein the input of the second differential amplifier is coupled to the input to the biquad filter and the output of the first differential amplifier is coupled to the output for the biquad filter when the output of the second differential amplifier is coupled to the input of the first differential amplifier.

12. The biquad filter of claim 11 wherein the biquad filter has a pole frequency, the pole frequency being a function of said at least one compensation resistor connected across the differential input of the second amplifier.

13. The biquad filter of claim 11 further comprising an input and output stage, wherein the input stage includes the first differential amplifier and the output stage includes the second differential amplifier when the output of the first differential amplifier is coupled to the input of the second differential amplifier.

14. The biquad filter of claim 11 further comprising an input and output stage, wherein the input stage includes the second differential amplifier and the output stage includes the first differential amplifier when the output of the second differential amplifier is coupled to the input of the first differential amplifier.

15. A biquad filter, comprising;
a first differential amplifier having a pair of input resistors $R_1$ and a pair of negative feedback resistors $R_2$;
a second differential amplifier having a pair of input resistors $R_3$, the second differential amplifier further having a negative feedback loop comprising a buffer and a plurality of compensation resistors $R_{C2}$ coupled to the buffer;
a negative feedback loop between the first and second amplifiers, the negative feedback loop comprising a pair of negative feedback resistors $R_4$; and
a load resistor $R_L$ coupled to an output of the first amplifier when an output of the second amplifier is coupled to an input of the first amplifier, and coupled to the output of the second amplifier when an output of the first amplifier is coupled to an input of the second amplifier;
wherein the input of the first amplifier is coupled to an input to the biquad filter and the output of the second amplifier is coupled to an output for the biquad filter when the output of the first amplifier is coupled to the input of the second amplifier,
wherein the input of the second amplifier is coupled to the input to the biquad filter and the output of the first amplifier is coupled to the output for the biquad filter when the output of the second amplifier is counted to the input of the first amplifier; and
wherein the resistors each have a value that satisfies the following equation:

$$\frac{R_{out1}}{R_1 \| R_2 \| R_3 \| R_4} = \frac{R_{out2}}{R_L \| R_4 \| R_{c2}} = \frac{R_{out3}}{R_{c2}}$$

16. The biquad filter of claim 15 wherein a gain of the buffer is set by the compensation resistors.

17. The biquad filter of claim 16 wherein the buffer comprises a unity gain buffer.

18. The biquad filter of claim 15 wherein the first and second differential amplifiers each comprises an operational amplifier.

19. The biquad filter of claim 15 further comprising a least one compensation resistor, different from the plurality of compensation resistors, connected across the differential input of the second amplifier.

20. The biquad filter of claim 15 further comprising an input and output stage, wherein the input stage includes the first differential amplifier, the output stage includes the second differential amplifier, and the second differential amplifier is coupled to the load resistor $R_L$, when the output of the first differential amplifier is coupled to the input of the second differential amplifier.

21. The biquad filter of claim 15 further comprising an input and output stage, wherein the input stage includes the second differential amplifier, the output stage includes the first differential amplifier, and the first differential amplifier is coupled to the load resistor $R_L$, when the output of the second differential amplifier is coupled to the input of the first differential amplifier.

22. A method of constructing a biquad filter, comprising:
coupling a pair of input resistors $R_1$ and a pair of negative feedback resistors $R_2$ to a first differential amplifier;
coupling a pair of input resistors $R_3$ to a second differential amplifier;
coupling a plurality of compensation resistors $R_{C2}$ to a buffer and placing the buffer and plurality of compensation resistors into a negative feedback loop of the second differential amplifier;
coupling a pair of negative feedback resistors $R_4$ between the first and second differential amplifiers;
coupling a load resistor $R_L$ to an output of the first differential amplifier when an output of the second differential amplifier is coupled to an input of the first differential amplifier, and to the output of the second differential amplifier when an output of the first differential amplifier is coupled to an input of the second differential amplifier; and
selecting the resistor values for the load resistor $R_L$ using the following equation:

$$\frac{R_{out1}}{R_1 \| R_2 \| R_3 \| R_4} = \frac{R_{out2}}{R_L \| R_4 \| R_{c2}} = \frac{R_{out3}}{R_{c2}}$$

wherein the input of the first differential amplifier is coupled to an input to the biquad filter and the output of the second differential amplifier is coupled to an output for the biquad filter when the output of the first differential amplifier is coupled to the input of the second differential amplifier, and wherein the input of the second differential amplifier is coupled to the input to the biquad filter and the output of the first differential amplifier is coupled to the output for the biquad filter when the output of the second differential amplifier is coupled to the input of the first differential amplifier.

23. The method of claim 22 further comprising coupling at least one compensation resistor, different from the plurality of compensation resistors, across the differential input of the second amplifier and selecting the resistor value far said at least one compensation resistor to set the pole frequency of the biquad filter.

24. An active filter, comprising:
a first biquad including a first amplifier and a second amplifier coupled to the first amplifier, the second amplifier having a negative feedback loop including a first buffer having a plurality of first compensation resistors, the first compensation resistors each having a resistance value that results in the first biquad filter having substantially zero Q-enhancement, wherein Q-enhancement represents an undesirable peak in amplitude around a pale frequency of an amplitude frequency response for the first biquad filter; and a second biquad including a third amplifier and a fourth amplifier coupled to the third amplifier, the third amplifier having a negative feedback loop including a second buffer having a plurality of second compensation resistors, the second compensation resistors each having a resistance value that results in the second biquad filter having substantially zero Q-enhancement, wherein Q-enhancement represents an undesirable peak in amplitude around a pole frequency of an amplitude frequency response for the second biquad filter.

25. The active filter of claim 24 wherein the first and second biquads are arranged in a ladder configuration with feedback from the second biquad to the first biquad.

* * * * *